United States Patent
Jang et al.

(10) Patent No.: US 9,211,884 B2
(45) Date of Patent: Dec. 15, 2015

(54) BATTERY INFORMATION DISPLAY APPARATUS OF ELECTRIC VEHICLE

(71) Applicant: LSIS CO., LTD., Anyang-si, Gyeonggi-do (KR)

(72) Inventors: Byung Woon Jang, Seoul (KR); Hong Tae Park, Cheongju-si (KR); Jae Hoon Jang, Seoul (KR); Yong Jin Kang, Cheonan-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 14/327,347

(22) Filed: Jul. 9, 2014

(65) Prior Publication Data

US 2015/0073633 A1 Mar. 12, 2015

(30) Foreign Application Priority Data

Sep. 9, 2013 (KR) .......................... 10-2013-0108129
Jan. 27, 2014 (KR) .......................... 10-2014-0009703

(51) Int. Cl.
*B60W 10/26* (2006.01)
*B60L 11/18* (2006.01)
*H01M 10/00* (2006.01)

(52) U.S. Cl.
CPC ............. *B60W 10/26* (2013.01); *B60L 11/1861* (2013.01); *H01M 10/00* (2013.01); *B60L 2240/545* (2013.01); *B60L 2240/547* (2013.01); *B60L 2240/549* (2013.01); *B60L 2250/16* (2013.01); *B60W 2510/244* (2013.01)

(58) Field of Classification Search
CPC ............ B60L 11/1861; B60L 11/1851; B60L 11/187; B60L 2240/545; B60L 2240/547; B60L 2240/549; B60L 2250/16; B60W 2510/244; B60W 2510/246; B60W 10/26; H01M 10/00

See application file for complete search history.

(56) References Cited

U.S. PATENT DOCUMENTS

| | | | | | |
|---|---|---|---|---|---|
| 5,397,991 | A | * | 3/1995 | Rogers | .......................... 320/125 |
| 5,691,078 | A | * | 11/1997 | Kozaki | ............... G01R 31/3624 320/DIG. 21 |
| 5,798,646 | A | * | 8/1998 | Arai | .................... B60L 11/1851 320/106 |
| 5,939,861 | A | * | 8/1999 | Joko et al. | ...................... 320/122 |
| 6,104,166 | A | * | 8/2000 | Kikuchi et al. | ................ 320/132 |
| 6,133,709 | A | * | 10/2000 | Puchianu | .............. B60L 3/0046 320/116 |
| 6,335,574 | B1 | * | 1/2002 | Ochiai et al. | ................. 290/40 C |
| 6,456,041 | B1 | * | 9/2002 | Terada | ................ B60L 11/1861 320/132 |
| 6,932,174 | B2 | * | 8/2005 | Hirata et al. | ............. 180/65.245 |
| 7,610,124 | B2 | * | 10/2009 | Wakashiro et al. | ............. 701/22 |
| 8,862,375 | B2 | * | 10/2014 | Heo | .................... B60L 11/1861 320/132 |

(Continued)

*Primary Examiner* — Jerrah Edwards
*Assistant Examiner* — Tamara Weber
(74) *Attorney, Agent, or Firm* — Lee, Hong, Degerman, Kang & Waimey

(57) ABSTRACT

A battery information display apparatus is provided. The battery information display apparatus includes a data storage unit storing battery capacity information according to temperature and current of a battery of an electric vehicle, an integrated power control unit providing power for charging the battery and driving a motor, a sensor measuring the temperature and current of the battery, and a display unit displaying a battery remnant. The integrated power control unit calculates the battery remnant from the battery temperature and current measured by the sensor on the basis of the battery capacity information according to the battery temperature and current stored in the data storage unit and provides the calculated battery remnant to the display unit.

12 Claims, 3 Drawing Sheets

(56) References Cited

U.S. PATENT DOCUMENTS

| | | | |
|---|---|---|---|
| 2004/0076872 A1* | 4/2004 | Kinoshita et al. | 429/61 |
| 2009/0088994 A1* | 4/2009 | Machiyama et al. | 702/63 |
| 2009/0321163 A1* | 12/2009 | Suzui | 180/65.265 |
| 2010/0081541 A1* | 4/2010 | Sugai | 477/5 |
| 2012/0283902 A1* | 11/2012 | Kusumi et al. | 701/22 |
| 2013/0175022 A1* | 7/2013 | King | B60H 1/00392 165/202 |

* cited by examiner

| C-rate | Current (A) | Time (hr) | Available Capacity (%) (k=1.25) | Available Capacity (%) (k=1.16) |
|---|---|---|---|---|
| C/20 | 10.0 | 20.00 | 100.0 | 100.0 |
| C/6 | 33.3 | 4.44 | 74.0 | 82.5 |
| C/5 | 40.0 | 3.54 | 70.7 | 80.1 |
| C/3 | 66.7 | 1.87 | 62.2 | 73.8 |
| 2C/3 | 133.3 | 0.78 | 52.3 | 66.1 |
| 1C | 200.0 | 0.47 | 47.3 | 61.9 |
| 1.5C | 300.0 | 0.28 | 42.7 | 58.0 |
| 2C | 400.0 | 0.20 | 39.8 | 55.4 |
| 2.5C | 500.0 | 0.15 | 37.6 | 53.5 |
| 3C | 600.0 | 0.12 | 35.9 | 51.9 |

Fig. 3

| TEMPERATURE(℃) | CALCULTATED CAPACITY(%) | TEMPERATURE(℃) | CALCULTATED CAPACITY(%) |
|---|---|---|---|
| -40 | 38.6 | 10 | 92.1 |
| -35 | 45.0 | 15 | 94.7 |
| -30 | 51.4 | 16 | 95.0 |
| -29 | 52.9 | 20 | 97.0 |
| -25 | 57.9 | 21 | 97.5 |
| -23 | 60.0 | 25 | 99.3 |
| -20 | 63.4 | 27 | 100.0 |
| -18 | 65.7 | 30 | 100.6 |
| -15 | 68.8 | 32 | 101.1 |
| -12 | 71.8 | 35 | 101.4 |
| -10 | 73.6 | 38 | 101.8 |
| -7 | 76.4 | 40 | 102.4 |
| -5 | 78.4 | 43 | 103.2 |
| -1 | 82.9 | 45 | 103.4 |
| 0 | 83.9 | 49 | 103.9 |
| 4 | 87.9 | 50 | 104.1 |
| 5 | 88.3 | 55 | 104.7 |

| Speed \ Current | 50A | 100A | 150A | 200A | 250A | 300A | 350A |
|---|---|---|---|---|---|---|---|
| 300rpm | 3 | 14 | 27 | 44 | 63 | 86 | 112 |
| 600rpm | 4 | 22 | 42 | 63 | 88 | 116 | 146 |
| 900rpm | 6 | 30 | 56 | 82 | 112 | 147 | 184 |
| 1200rpm | 8 | 38 | 69 | 101 | 138 | 178 | 220 |
| 1500rpm | 10 | 47 | 83 | 120 | 162 | 208 | 257 |
| 1800rpm | 11 | 54 | 96 | 140 | 187 | 240 | 294 |
| 2100rpm | 15 | 58 | 102 | 147 | 195 | 247 | 302 |
| 2400rpm | 20 | 59 | 104 | 152 | 199 | 250 | 305 |
| 2700rpm | 23 | 60 | 105 | 153 | 202 | 254 | 315 |
| 3000rpm | 24 | 60 | 106 | 155 | 203 | 259 | 318 |

BATTERY INFORMATION DISPLAY APPARATUS OF ELECTRIC VEHICLE

CROSS-REFERENCE TO RELATED APPLICATIONS

Pursuant to 35 U.S.C. §119(a), this application claims the benefit of earlier filing date and right of priority to Korean Patent Application Nos. 10-2014-0009703, filed on Jan. 27, 2014, and 10-2013-0108129, filed on Sep. 9, 2013, the contents of which are all hereby incorporated by reference herein in their entirety.

BACKGROUND

The present disclosure relates to a battery information display apparatus of an electric vehicle, and particularly, to a battery information display apparatus of an electric vehicle which calculates a battery remnant and displays a distance to empty in a low-cost electric vehicle that does not use a battery management system (BMS).

In an electric vehicle, battery information is typically managed by using a battery management system. The BMS is for managing a battery used in the electric vehicle. That is, it is an apparatus of the electric vehicle for measuring a battery remnant, a consumed current, a charging current, and temperature, etc., to provide them to a user, and for protecting a battery and a driver when abnormality such as overcurrent, or overvoltage occurs in relation to battery safety. However, most low-cost electric vehicles do not use the BMS. In this case, the battery remnant is required to be measured by another apparatus. When separate equipment is additionally used, lots of additional expenses such as cost, personal expense, weight, and size are incurred.

SUMMARY

Embodiments provide a battery information display apparatus of an electric vehicle which calculates a battery remnant and displays a distance to empty in a low-cost electric vehicle that does not use a battery management system (BMS)

In one embodiment, a battery information display apparatus includes: a data storage unit storing battery capacity information according to temperature and current of a battery of an electric vehicle; an integrated power control unit providing power for charging the battery and driving a motor; a sensor measuring the temperature and current of the battery; and a display unit displaying a battery remnant, wherein the integrated power control unit calculates the battery remnant from the battery temperature and current measured by the sensor on the basis of the battery capacity information according to the battery temperature and current stored in the data storage unit and provides the calculated battery remnant to the display unit.

The integrated power control unit may calculate the battery remnant according to the following Equation:

$$SOC_{t+1} = SOC_t + \frac{\sum I_{Batt}(t) \times \Delta t}{C_0}$$

where, SOC denotes the battery remnant, $SOC_t$ denotes SOC at a starting point, $SOC_t+1$: SOC at a next point, $I_{Batt}$ denotes a charge/discharge current of the battery, $\Delta t$ denotes a calculation time interval, and C0 denotes rated capacity.

The data storage unit may further store battery current consumption information and official mileage information according to a motor driving current and speed, the sensor may further measure the motor driving current and speed, the display unit may further display a distance to empty, and the integrated power control unit may calculate the distance to empty according to driving on the basis of the battery current consumption information according to the motor driving current and speed, and the official mileage information, and may further provide the calculated distance to empty to the display unit.

The integrated power control unit may calculate driving state based battery available capacity in correspondence to the battery current consumption information according to the motor driving current and speed, and calculates the distance to empty according to the driving on the basis of the driving state based battery available capacity and the official mileage information.

The integrated power control unit may calculate the distance to empty according to the following Equation:

DTE=official mileage*driving state based battery available capacity*SOC where, the DTE denotes the distance to empty and SOC denotes the battery remnant.

The data storage unit may store driving history information and charge/discharge information, and the integrated power control unit may calculate an optimal driving condition on the basis of the driving history information and the charge/discharge information stored in the data storage unit, and may display the calculated optimal driving condition on the display unit.

The optimal driving condition may include the motor driving current and speed.

The integrated power control unit may transmit the driving history information, the charge/discharge information, and the optimal driving condition to a device or a server for managing the electric vehicle through a wired or wireless communication interface.

In another embodiment, a battery information display apparatus includes: a storage unit storing battery capacity information according to temperature and current of a battery of an electric vehicle; an integrated power control unit providing power for charging the battery and driving a motor and measuring the battery current and motor temperature or temperature of the integrated power control unit; and a display unit displaying a battery remnant, wherein the data storage unit comprises association information between the motor temperature or the integrated power control unit temperature and the battery temperature, and the integrate power control unit estimates the battery temperature from the motor temperature or the integrated power control unit temperature on the basis of the association information, calculates the battery remnant from the estimated battery temperature and the battery current on the basis of the battery capacity information according to the battery temperature and current stored in the data storage unit, and provides the calculated battery remnant to the display unit.

The integrated power control unit may calculate the battery remnant according to the following Equation:

$$SOC_{t+1} = SOC_t + \frac{\sum I_{Batt}(t) \times \Delta t}{C_0}$$

where, SOC denotes the battery remnant, $SOC_t$ denotes SOC at a starting point, $SOC_t+1$: SOC at a next point, $I_{Batt}$ denotes a charge/discharge current of the battery, $\Delta t$ denotes a calculation time interval, and CO denotes rated capacity.

The data storage unit may further store battery current consumption information and official mileage information according to a motor driving current and speed, the integrated power control unit may measure the motor driving current and speed, the display unit may further display a distance to empty, and the integrated power control unit may calculate the distance to empty according to driving on the basis of battery current consumption information and official mileage information according to the motor driving current and speed, and provide the calculated distance to empty to the display unit.

The integrated power control unit may calculate driving state based battery available capacity in correspondence to the battery current consumption information according to the motor driving current and speed, and calculate the distance to empty according to the driving on the basis of the driving state battery available capacity and the official mileage information.

The integrated power control unit may calculates the distance to empty according to the Equation:

DTE=official mileage*driving state based battery available capacity*SOC where, the DTE denotes the distance to empty and SOC denotes the battery remnant.

The data storage unit may store driving history information and charge/discharge information, and the integrated power control unit may calculate an optimal driving condition on the basis of the driving history information and the charge/discharge information stored in the data storage unit and may display the optimal driving condition on the display unit.

The optimal driving condition may include the motor driving current and speed.

The integrated power control unit may transmit the driving history information, the charge/discharge information, and the optimal driving condition to a device or a server for managing the electric vehicle through a wired or wireless communication interface.

In further another embodiment, a battery information display apparatus includes: a data storage unit storing battery capacity information according to temperature and current of a battery of an electric vehicle, battery current consumption information and official mileage information according to a motor driving current and speed; an integrated power control unit providing power for charging the battery and driving a motor; a sensor measuring the temperature and current of the battery and the motor driving current and speed; and a display unit displaying a distance to empty, wherein the integrated power control unit calculates the battery remnant from the battery temperature and current measured by the sensor on the basis of the battery capacity information according to the battery temperature and current stored in the data storage unit, calculates the distance to empty according to driving on the basis of the battery current consumption information according to the motor driving current and speed, and the official mileage information, and further provides the calculated distance to empty to the display unit.

In still further another embodiment, a battery information display apparatus includes: a data storage unit storing battery capacity information according to temperature and current of a battery of an electric vehicle, battery current consumption information and official mileage information according to a motor driving current and speed; an integrated power control unit providing power for charging the battery and driving a motor and measuring the battery current and motor temperature or temperature of the integrated power control unit, and the motor driving current and speed; a display unit displaying a distance to empty; wherein the data storage unit comprises association information between the motor temperature or the integrated power control unit temperature and the battery temperature, and the integrate power control unit estimates the battery temperature from the motor temperature or the integrated power control unit temperature on the basis of the association information, calculates the battery remnant from the estimated battery temperature and the battery current on the basis of the battery capacity information according to the battery temperature and current stored in the data storage unit, calculates the distance to empty according to driving on the basis of battery current consumption information and official mileage information according to the motor driving current and speed, and provides the calculated distance to empty to the display unit.

The integrated power control unit may calculate the battery remnant according to the following Equation:

$$SOC_{t+1} = SOC_t + \frac{\sum I_{Batt}(t) \times \Delta t}{C_0}$$

where, SOC denotes the battery remnant, $SOC_t$ denotes SOC at a starting point, $SOC_t+1$: SOC at a next point, $I_{Batt}$ denotes a charge/discharge current of the battery, $\Delta t$ denotes a calculation time interval, and CO denotes rated capacity.

The integrated power control unit may calculate driving state based battery available capacity in correspondence to the battery current consumption information according to the motor driving current and speed, and calculate the distance to empty according to the driving on the basis of the driving state battery available capacity and the official mileage information.

The integrated power control unit may calculates the distance to empty according to the Equation:

DTE=official mileage*driving state based battery available capacity*SOC where, the DTE denotes the distance to empty and SOC denotes the battery remnant.

The data storage unit may store driving history information and charge/discharge information, and the integrated power control unit may calculate an optimal driving condition on the basis of the driving history information and the charge/discharge information stored in the data storage unit and may display the optimal driving condition on the display unit.

The optimal driving condition may include the motor driving current and speed.

The integrated power control unit may transmit the driving history information, the charge/discharge information, and the optimal driving condition to a device or a server for managing the electric vehicle through a wired or wireless communication interface.

The details of one or more embodiments are set forth in the accompanying drawings and the description below. Other features will be apparent from the description and drawings, and from the claims.

BRIEF DESCRIPTION OF THE DRAWINGS

FIG. 3 is a view illustrating battery capacity information due to temperature according to an embodiment.

DETAILED DESCRIPTION OF THE EMBODIMENTS

Figures 1, 2:
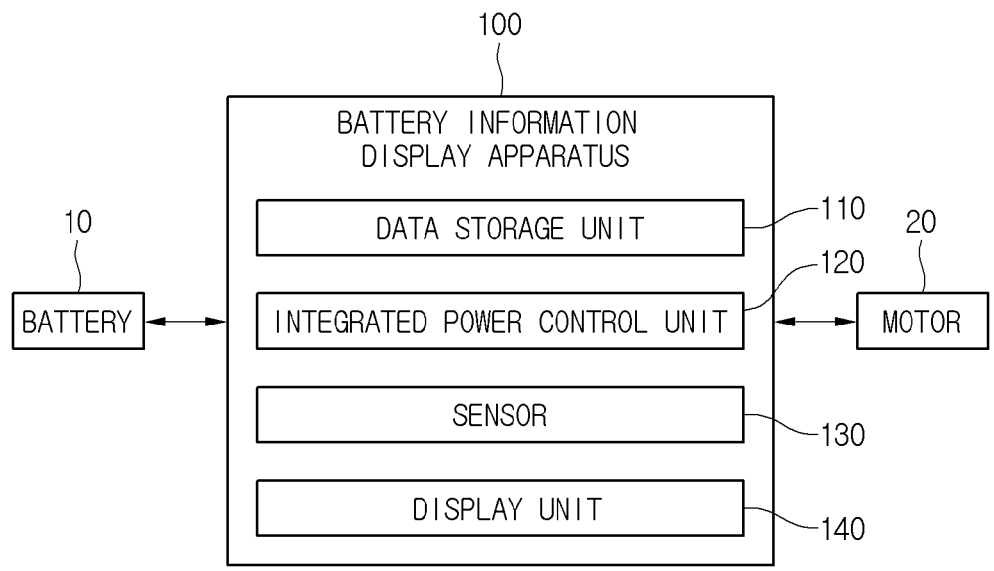
FIG. 1 is view illustrating a battery information display apparatus of an electric vehicle according to an embodiment.
FIG. 2 is a view illustrating battery capacity information due to a current according to an embodiment.

Reference will now be made in detail to the embodiments of the present disclosure, examples of which are illustrated in the accompanying drawings. The inventive concepts may, however, be embodied in different forms and should not be construed as limited to the embodiments set forth herein. In addition, in the drawings, widths, lengths, and thicknesses of elements may be exaggerated for convenience of explanation. Like reference numerals refer to like elements throughout.

FIG. 1 is a view illustrating a battery information display apparatus of an electric vehicle according to an embodiment.

Referring to FIG. 1, a battery information display apparatus 100 of an electric vehicle according to an embodiment includes a data storage unit 110, an integrated power control unit (IPCU) 120, a sensor 130, and a display unit 140.

The data storage unit 110 may store battery capacity information according to battery temperature and a battery current of an electric vehicle. The data storage unit 110 may store battery current consumption information according to a motor driving current and speed in an electric vehicle. The data storage unit 110 stores official mileage of an electric vehicle. The official mileage of the electric vehicle may be displayed as, for example, a ratio of a driving distance over a used amount of electricity. The present invention is not limited hereto and the official mileage of the electric vehicle may be represented in various schemes. The data storage unit 110 may store driving history information. The driving history information may include driving information including the motor driving current and speed. The data storage unit 110 may include charge/discharge information.

FIG. 2 is a view illustrating battery capacity information due to a current according to an embodiment.

Referring to FIG. 2, the data storage unit 110 stores battery capacity information due to a current. Here, a lead-acid battery is used for the battery 10 and FIG. 2 shows a capacity variation of the lead-acid battery according to a current variation amount.

Here, C-rate denotes a current rate. As a unit for setting a current value and predicting or representing available use time under various use conditions during charging or discharging a battery, a current value according to a charge/discharge rate is calculated by dividing a charge or discharge current by a value that a unit of battery's rated capacity is removed from the battery's rated capacity. The unit of C-rate is C.

Here, that C-rate is 1 means that a discharge current is identical to the battery's rated capacity. When C-rate is c/20 by substituting 20 for a weight, battery capacity means that, when discharge occurs in a discharge current of 20 A, the battery may be used for 10.0 hrs. At this point, it is meant that battery available capacity is 100%, when K=1.25.

Similarly, when C-rate is c/6 by substituting 6 for the weight, the battery capacity means that, when discharge occurs in a discharge current of 33.3 A, the battery may be used for 4.44 hrs. At this point, it is meant that battery available capacity is 74.0%, when K=1.25.

The battery 10 may be confirmed to have capacity variation according to current amount variation of the battery 10. Accordingly, the capacity variation of the battery occurs due to current amount variation according to charge/discharge of the battery 10.

Figures 4, 5:
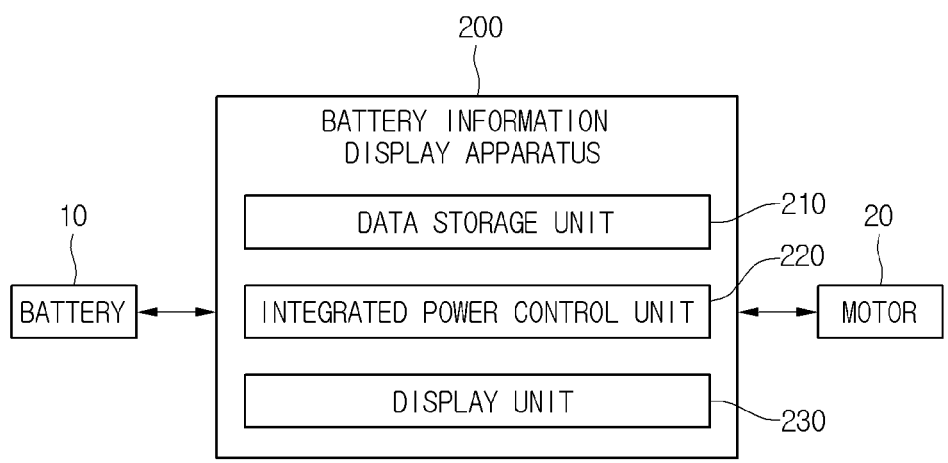
FIG. 4 is a view illustrating battery current consumption information due to a motor driving current and speed according to an embodiment.
FIG. 5 is a view illustrating a battery information display apparatus of an electric vehicle according to another embodiment.

In capacity variation of a lead-acid battery according to the current variation amount, when current consumption value is set to the current variation amount according to a driving state to be described in relation to FIG. 4, driving state based battery available capacity may be calculated.

FIG. 3 is a view illustrating battery capacity information due to temperature according to an embodiment.

Referring to FIG. 3, the data storage unit 110 stores battery capacity information due to temperature. Here, the battery 10 employs a lead-acid battery and shows capacity variation of the lead-acid battery according to a temperature variation amount. It may be known that capacity variation occurs in the battery 10 according to temperature variation.

FIG. 4 is a view illustrating battery current consumption information according to a motor driving current and speed according to an embodiment.

Referring to FIG. 4, the data storage unit 110 stores battery current consumption information according to a motor driving current and speed according to an embodiment. Here, the battery 10 employs a lead-acid battery, and battery current consumption variation may be confirmed according to the motor driving current and speed.

In the battery 10, it may be confirmed that battery current consumption may be varied according to the motor driving current and speed. During driving the electric vehicle, the motor driving current and speed may be varied due to an acceleration or deceleration operation by the driver. Accordingly, it may be known that the battery current consumption is varied by the acceleration or deceleration operation of the driver during driving the electric vehicle.

Accordingly, when the current consumption value according to the driving state is set to the current variation value in the lead-acid battery capacity variation according to the current variation described in relation to FIG. 2, the driving state based battery available capacity may be calculated for the lead-acid capacity.

The integrated power control unit 120 may provide power for charging the battery and driving the motor.

The integrated power control unit 120 may calculate a battery remnant from the temperature and current of the battery, which are measured by the sensor 130, on the basis of the battery capacity information according to temperature and current of the battery stored in the data storage unit 110.

The integrated power control unit 120 may display the calculated battery remnant on the display unit 140.

The integrated power control unit 120 may calculate battery current consumption value from the motor driving current and speed measured by the sensor 130 on the basis of the battery current consumption information according to the motor driving current and speed, which are stored in the data storage unit 110.

The integrated power control unit 120 may calculate the driving state based battery available capacity corresponding to the calculated battery current consumption value. The driving state based battery available capacity is calculated from a battery capacity variation value corresponding to the battery current consumption value on the basis of the battery capacity information due to a current, which is stored in the data storage unit 110.

The integrated power control unit 120 may calculate a distance to empty of the electric vehicle on the basis of the battery remnant, the driving state based battery available capacity, and official mileage.

The integrated power control unit 120 may calculate an optimal driving condition on the basis of driving history information and charge/discharge information stored in the data storage unit 110 and display the calculated optimal driving condition on the display unit 140. The optimal driving condition may include the motor driving current and speed.

The integrated power control unit 120 may transmit the driving history information, charge/discharge information, or optimal driving condition information stored in the data storage unit 110 to a device or a server for managing the electric vehicle through a wired or wireless communication interface.

The sensor 130 may measure the temperature and current of the battery 10. The sensor 130 may include a temperature sensor for detecting temperature of the battery 10 and a battery current sensor for detecting a current of the battery 10. The temperature sensor and the current sensor may be implemented as an integrated type or a separate type. Here, since the temperature sensor is typically mounted on an engine room together with the battery and the motor, the temperature sensor may be a motor temperature sensor measuring temperature of the motor.

The sensor 130 may measure the motor driving current and speed. The sensor 130 may include a motor current sensor for detecting the motor driving current and a speed sensor for detecting the motor driving speed. The motor current sensor and the speed sensor may be implemented as an integrated type or a separate type.

The display unit 140 may display a distance to empty. The display unit 140 may be implemented in a cluster of an electric vehicle. In addition, the display unit 230 may display the calculated optimal driving condition to the user.

The integrated power control unit 120 may calculate the battery remnant according to the following Equation:

$$SOC_{t+1} = SOC_t + \frac{\sum I_{Batt}(t) \times \Delta t}{C_0} \quad (1)$$

where, SOC denotes a battery remnant, $SOC_t$ denotes SOC at a starting point, $SOC_{t+1}$: SOC at a next point, $I_{Batt}$ denotes a charge/discharge current of the battery, $\Delta t$ denotes a calculation time interval, and $C_O$ denotes rated capacity.

The battery remnant is calculated by adding, to a battery remnant at a starting point of calculating the battery remnant, a value that an accumulated value of current variation of the battery, which is generated during a calculation interval, is divided by battery capacity. The current variation $I_{Batt}$ of the battery is a positive (+) value in case of charge and a negative (−) value in case of discharge. In a battery charging operation, the current variation $I_{Batt}$ of the battery may be calculated in consideration of a charge current value provided to the battery and battery available capacity. During driving the electric vehicle, the battery is discharged. In this case, the current variation $I_{Batt}$ of the battery may be calculated by the battery current consumption value according to the motor driving current and speed as shown in FIG. 4.

The integrated power control unit 120 may calculate a distance to empty according to the following Equation 2:

$$DTE = \text{official mileage} * \text{riving state based battery available capacity} * SOC \quad (2)$$

where, the official mileage may be represented as a ratio of a used electricity amount and a driving distance. The driving state based battery available capacity denotes the battery available capacity shown in FIG. 2. SOC denotes a battery remnant.

It may be confirmed that the battery 10 has capacity variation according to the current variation thereof. Accordingly, it may be seen that capacity of the battery 10 is varied by the current variation according to the charge or discharge of the battery 10.

FIG. 5 is a view illustrating battery information display apparatus of an electric vehicle according to another embodiment.

Referring to FIG. 5, a battery information display apparatus 200 of an electric vehicle according to another embodiment may include a data storage unit 210, an integrated power control unit 220, and a display unit 230.

The data storage unit 210 may store battery capacity information according to battery temperature and current of an electric vehicle.

The battery capacity information according to the battery temperature and current of an electric vehicle, which is stored in the data storage unit 210, is the same as shown in FIGS. 2 and 3.

The data storage unit 210 may store battery current consumption information according to the motor driving current and speed.

The battery current consumption information according to the battery according to the motor driving current and speed stored in the data storage unit 210 is the same as shown in FIG. 4.

The data storage unit 210 stores association information between temperature of the motor 20 or temperature of the integrated power control unit 200 and the temperature information of the battery 10. The temperature of the motor 20 or the temperature of the integrated power control unit 200 may be measured by the integrated power control unit 200.

The data storage unit 210 stores official mileage of an electric vehicle. The official mileage of the electric vehicle may be represented as, for example, a ratio of a used electricity amount and a driving distance. The embodiment is not limited hereto, and the official mileage of an electric vehicle may be represented in various schemes.

The data storage unit 210 may store driving history information. The driving history information may include driving information including the motor driving current and speed. The data storage unit 210 may include charge/discharge information.

The integrated power control unit 220 provides power for charging the battery 10 and driving the motor 20, and may measure the battery current and the temperature of the motor 20 or the temperature of the integrated power control unit 200.

The integrated power control unit 220 may estimate the temperature of the battery 10 from the temperature of the motor 10 or the temperature of the integrated power control unit 200 on the basis of the association information stored in the data storage unit 210.

The integrated power control unit 220 may calculate a battery current in consideration of a charge current value provided to the battery and charging efficiency.

The integrated power control unit 220 may calculate a remnant of the battery 10 from the estimated battery temperature and the calculated battery current.

The integrated power control unit 220 may calculate the battery remnant according to Equation (1).

The integrated power control unit 220 may display the calculated battery remnant on the display unit 230.

The integrated power control unit 220 may measure the motor driving current and speed.

The integrated power control unit 220 may calculate the battery current consumption value from the measured motor driving current and speed on the basis of the battery current consumption information according to the motor driving current and speed stored in the data storage unit 210.

The integrated power control unit 220 may calculate driving state based battery available capacity corresponding to the calculated battery current consumption value. The driving state based battery available capacity may be calculated from battery capacity variation value corresponding to the battery current consumption value on the basis of the battery capacity information according to the current stored in the data storage unit 210.

The integrated power control unit 220 may calculate a distance to empty of an electric vehicle on the basis of the battery remnant, the driving state based battery available capacity, and official mileage.

The integrated power control unit 220 may calculate the distance to empty according to Equation (2).

On the other hand, the integrated power control unit 220 may calculate an optimal driving condition on the basis of the driving history information and charge/discharge information stored in the data storage unit 210 and display the optimal driving condition on the display unit 230. The optimal driving condition may include the motor driving current and speed.

The integrated power control unit 220 may transmit the driving history information, charge/discharge information, and the optimal driving condition stored in the data storage unit 210 to a device or a server for managing the electric vehicle through a wired or wireless communication interface.

The display unit 230 may display the calculated distance to empty to a user. The display unit 230 may be implemented in a cluster of the electric vehicle. In addition, the display unit 230 may display the calculated optimal driving condition to the user.

According to embodiments, a low-cost electric vehicle can be produced by calculating a battery remnant from information on current and temperature measured by a separate sensor from an integrated power control unit or the integrated power control unit itself and displaying a distance to empty according to a driving state even without using a BMS mounted on an expensive electric vehicle for battery management.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A battery information display apparatus comprising:
a data storage unit that stores battery capacity information according to temperature and current of an electric vehicle battery, stores battery current consumption information according to driving current and speed of a motor and stores official mileage information;
a sensor that measures temperature and current of the battery and measures driving current and speed of the motor;
a display unit that displays information; and
an integrated power control unit that:
provides power for charging the battery and driving the motor;
calculates a State of Charge (SOC) of the battery based on the measured temperature and current of the battery and the stored battery capacity information;
calculates battery available capacity based on the stored battery current consumption information and the measured driving current and speed of the motor; and
calculates a distance to empty (DTE) based on the stored official mileage information and the calculated battery available capacity, the DTE calculated according to the Equation:

DTE=official mileage information*battery available capacity*SOC, wherein the display unit displays the SOC and DTE.

2. The apparatus according to claim 1, wherein the integrated power control unit calculates the SOC according to the following Equation:

$$SOC_{t+1} = SOC_t + \frac{\sum I_{Batt}(t) \times \Delta t}{C_0}$$

wherein $SOC_t$ is the SOC at a starting point, $SOC_{t+1}$ is the SOC at a next point, $I_{Batt}$ is a charge/discharge current of the battery, $\Delta t$ is a calculation time interval, and $C_O$ is rated capacity of the battery.

3. The apparatus according to claim 1, wherein:
the data storage unit stores driving history information and charge/discharge information;
the integrated power control unit calculates an optimal driving condition based on the stored driving history information and charge/discharge information; and
the display unit displays the calculated optimal driving condition.

4. The apparatus according to claim 3, wherein the optimal driving condition comprises driving current and speed of the motor.

5. The apparatus according to claim 3, wherein the integrated power control unit transmits the driving history information, the charge/discharge information, and the optimal driving condition via a communication interface to a device or a server for managing the electric vehicle.

6. A battery information display apparatus comprising:
a data storage unit that stores battery capacity information according to temperature and current of an electric vehicle battery, stores association information between temperature of a motor or an integrated power control unit and the temperature of the battery, stores battery current consumption information according to driving current and speed of the motor and stores official mileage information;
a display unit that displays information; and
the integrated power control unit that:
provides power for charging the battery and driving the motor;
measures current of the battery, temperature of the motor, temperature of the integrated power control unit and the driving current and speed of the motor;
estimates the temperature of the battery based on the measured temperature of the motor or integrated power control unit and the stored association information;

calculates a State of Charge (SOC) of the battery based on the estimated temperature, measured current and stored battery capacity information; and calculates distance to empty (DTE) based on the stored current consumption information and official mileage information, wherein the display unit displays the SOC and DTE.

7. The apparatus according to claim 6, wherein the integrated power control unit calculates the SOC according to the following Equation:

$$SOC_{t+1} = SOC_t + \frac{\sum I_{Batt}(t) \times \Delta t}{C_0}$$

wherein $SOC_t$ is the SOC at a starting point, $SOC_{t+1}$ is the SOC at a next point, $I_{Batt}$ is a charge/discharge current of the battery, $\Delta t$ is a calculation time interval, and $C_O$ is rated capacity of the battery.

8. The apparatus according to claim 6, wherein the integrated power control unit calculates battery available capacity corresponding to the stored battery current consumption information and calculates the DTE based on the calculated battery available capacity and stored official mileage information.

9. The apparatus according to claim 8, wherein the integrated power control unit calculates the DTE according to the Equation:

DTE=official mileage information*battery available capacity*SOC.

10. The apparatus according to claim 6, wherein:

the data storage unit stores driving history information and charge/discharge information;

the integrated power control unit calculates an optimal driving condition based on the stored driving history information and charge/discharge information; and the display unit displays the optimal driving condition.

11. The apparatus according to claim 10, wherein the optimal driving condition comprises the driving current and speed of the motor.

12. The apparatus according to claim 10, wherein the integrated power control unit transmits the driving history information, the charge/discharge information, and the optimal driving condition via a communication interface to a device or a server for managing the electric vehicle.

* * * * *